United States Patent [19]
McClure

[11] Patent Number: 5,257,226
[45] Date of Patent: Oct. 26, 1993

[54] INTEGRATED CIRCUIT WITH SELF-BIASED DIFFERENTIAL DATA LINES

[75] Inventor: David C. McClure, Carrollton, Tex.

[73] Assignee: SGS-Thomson Microelectronics, Inc., Carrollton, Tex.

[21] Appl. No.: 809,733

[22] Filed: Dec. 17, 1991

[51] Int. Cl.$^5$ .............................................. G11C 00/00
[52] U.S. Cl. ............................ 365/189.09; 365/230.06
[58] Field of Search ......... 365/230.06, 189.09–189.11, 365/233.03, 207, 208, 190

[56] References Cited

U.S. PATENT DOCUMENTS

| | | | |
|---|---|---|---|
| 4,394,748 | 7/1983 | Campbell | 365/230.06 |
| 4,494,219 | 1/1985 | Tanaka | 365/189.09 |
| 4,813,020 | 3/1989 | Iwamura | 365/189.09 |
| 4,817,055 | 3/1989 | Arakawa | 365/189.09 |
| 4,961,170 | 10/1990 | Fujitsu | 365/19.09 |
| 4,992,677 | 2/1991 | Ishibashi | 365/230.06 |
| 5,062,082 | 10/1991 | Choi | 365/230.06 |
| 5,109,187 | 4/1992 | Guliani | 365/189.09 |
| 5,146,427 | 9/1992 | Sasaki | 365/190 |

*Primary Examiner*—Eugene R. LaRoche
*Assistant Examiner*—A. Zarabian
*Attorney, Agent, or Firm*—Rodney M. Anderson; Lisa K. Jorgenson; Richard K. Robinson

[57] ABSTRACT

An integrated circuit, such as a memory, having an internal data bus and circuitry for precharging the same, with each data conductor in the said data bus associated with a dummy data conductor, which is driven to a complementary logic state from that of its associated data conductor. During precharge and equilibration at the beginning of a cycle, initiated by an address transition detection or by a clock signal, each data conductor is connected to its dummy data conductor so that the data conductor is precharged to a midlevel by way of charge sharing. Also during precharge and equilibration, the data driver is placed in a high impedance state by the sense amplifier output nodes both going to the same logic level. This midlevel precharge allows for faster switching, and reduced instantaneous current, than obtained for rail-to-rail switching. Self-biasing circuits are connected to each of the data conductors and dummy data conductors, to prevent floating conditions during long precharge and equilibration periods. The output stage receiving the data conductor is preferably disabled during precharge and equilibration, so that the data conductor can be precharged near the trip level of the output stage, without risking output stage oscillations. A termination is also provided for the dummy data conductor, matching the load presented by the output stage to the data conductor, so that the data conductor and its dummy data conductor are at complementary states even during transient conditions.

17 Claims, 4 Drawing Sheets

INTEGRATED CIRCUIT WITH SELF-BIASED DIFFERENTIAL DATA LINES

This application is related to copending applications Ser. Nos. 809,392 and 809,397, both filed contemporaneously herewith, and assigned to SGS-Thomson Microelectronics, Inc.

This invention is in the field of integrated circuits, and is more particularly directed to data communication therewithin.

BACKGROUND OF THE INVENTION

Many integrated circuits communicate multiple bits of digital data in parallel at various times in their operation by way of an internal data bus, consisting of a set of parallel conductors to which multiple circuit functions are connected. In particular, memory circuits often include a data bus to facilitate access from memory cells at various locations within the chip. For example, an internal data bus is particularly useful in memories organized into sub-arrays, or blocks of memory cells, where access of a selected memory cell does not require enabling of the entire memory device. The resulting power savings makes such partitioned memory arrays especially useful in low power memories for portable computers.

Modern memory circuits are required to operate at high speeds while being fabricated with the highest density technology. In such memories, the series resistance and parasitic capacitance of relatively long conductors, such as data bus lines, can become a significant factor in the operating performance of the memory, as such parasitic capacitance affects the time required for the conductor to switch from one digital state to the other. Furthermore, as memory circuits become increasingly dense, the cross-sectional area allowable for the data bus conductors decreases, in turn increasing the resistance of the data bus conductors and increasing the time constant of its switching, particularly if the data bus conductor must fully switch between ground and the power supply voltage (i.e., from "rail to rail").

Of course, the increased R-C load of the data bus conductors can be overcome by increasing the size of the transistors driving the bus. Increases in the size of transistors of course runs counter to the desire to increase the density of memory integrated circuits. Furthermore, the driver transistors must fit within the "pitch" allowed for their associated sense amplifier, as any excess size will directly affect the chip size, and thus the manufacturing cost of the integrated circuit; indeed, the capacitance added to the data bus by the drivers themselves, where multiple drivers are driving the same bus, can outweigh the benefit of the larger drive capacity. Furthermore, in some cases the R-C load of the data bus may be too great for any reasonably sized driver to meet the desired switching time from rail to rail.

In addition, certain integrated circuits have data line pairs for the communication of data by way of a differential signal, and which are precharged and equilibrated to a particular voltage. During long cycle operations, however, noise and other effects can cause these precharged lines to charge or discharge to an undesirable voltage, causing a delay in the next operation in charging (or discharging) the differential lines.

It is therefore an object of the present invention to provide a circuit and technique for maintaining the bias of differential data lines, without requiring activation of a driver circuit.

It is a further object of this invention to provide such a technique incorporating a dummy data bus conductor, and in which floating conditions on the dummy data bus conductor are avoided.

It is a further object of this invention to provide such a technique which precharges the data bus conductor near the trip point of the output stage, without risking oscillations.

Other objects and advantages of the present invention will become apparent to those of ordinary skill in the art having reference to the following specification together with the drawings.

SUMMARY OF THE INVENTION

The invention may be implemented in an integrated circuit, such as a memory, which has differential data lines precharged or equilibrated toward a particular voltage, by providing self-biasing circuits for each data line. The self-biasing is provided to prevent the differential and complementary data conductors from floating to undesired voltages during long equilibration operations. The data conductors may be received by a tristatable output stage which is disabled during precharge and equilibration, and which matches the point to which the self-biasing circuits maintain the data lines.

DETAILED DESCRIPTION OF THE PREFERRED EMBODIMENT

Figure 1:
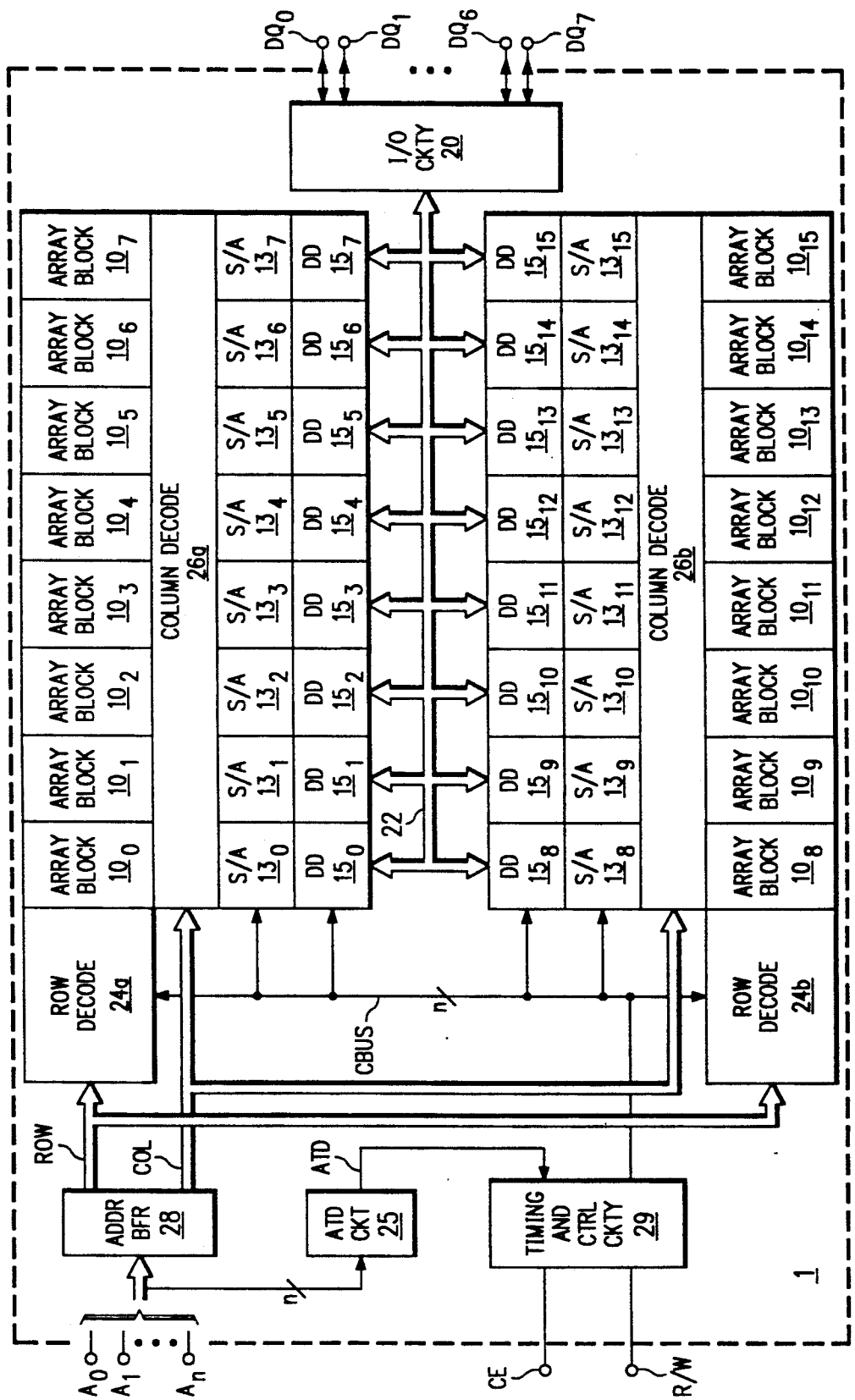
FIG. 1 is an electrical diagram, in block form, illustrating the architecture of a memory integrated circuit into which the preferred embodiment of the invention may be incorporated.

Referring now to FIG. 1, an example of an integrated circuit into which the preferred embodiment of the invention is implemented will be described. In this example, memory 1 is a static random access memory (SRAM) of otherwise conventional architecture, having its memory cells in multiple blocks 10 which are shown, in FIG. 1, according to an example of their physical location in such a memory. It is contemplated that integrated circuits of other types which utilize long data conductors may also benefit from the present invention, such integrated circuits including microprocessors, logic devices, and other types of memories including read-only memories, FIFOs, DRAMs and the like.

As is conventional, memory cells in memory 1 are arranged in rows and columns, and are selected according to an address signal received at address terminals $A_0$ through $A_n$. Address terminals $A_0$ through $A_n$ are connected to address buffers 28, which buffer the received address signal and communicate a portion of the address signal to row decoders 24a, 24b on bus ROW, and communicate the remainder to column decoders 26a, 26b on bus COL. Row decoders 24a, 24b select a row of memory cells by enabling the selected word line, in the conventional manner, and are thus preferably located along a side of the memory array blocks 10. Column decoders 26a, 26b, in this example, select eight memory cells in the selected row to be sensed by a sense amplifier 13 according to the column portion of the address.

In memory 1 according to this example, the memory cells are grouped into sixteen array blocks $10_0$ through $10_{15}$. This partitioning of the memory into sixteen array blocks 10 is particularly beneficial in low power memories, such as may be used in portable computers, as only the block 10 in which the selected memory cells are located need be enabled during a cycle. Selection of the block may be done according to one of the row address bits (indicating upper or lower half) and to four of the column address bits (indicating one of sixteen array blocks 10 to be selected). Further reduction in the active power may be obtained by the implementation of latched row line repeaters between array blocks 10, as described in copending application Ser. No. 588,609, filed Sept. 26, 1990, assigned to SGS-Thomson Microelectronics, Inc., and incorporated herein by this reference.

Memory 1, as in the case of most modern SRAMs and DRAMs, includes some amount of dynamic operation, such as precharging and equilibration of certain nodes (e.g., bit lines) at particular points in the memory cycle. Initiation of the cycle in SRAM 1 occurs by way of address transition detection, performed by address transition detection (ATD) circuit 25. ATD circuit 25 is connected to each of the address inputs $A_0$ through $A_n$, preferably prior to address buffers 28 (as shown), and generates a pulse on line ATD responsive to detecting a transition at any one or more of address inputs $A_0$ through $A_n$, such a pulse useful in controlling the internal operation of memory 1 in the conventional manner, and also in the manner to be described hereinbelow.

Other internal operational functions are controlled by timing and control circuitry 29, which receives the signal on line ATD from ATD circuit 25, and which also receives certain external control signals such as the chip enable signal at terminal CE, and the read/write select signal at terminal R/W. Timing and control circuitry 29 generates various control signals based on these inputs, for control of the various functions within memory 1 in the conventional manner. As shown in FIG. 1, control bus CBUS is connected to sense amplifiers 13 and data drivers 15, by which such signals as the GEQT, GEQC, $SAEQ_{13}$, SCLK, ISO signals described hereinbelow are generated and communicated within memory 1.

Memory 1 in this example is of the byte-wide type, and as such it has eight input/output terminals $DQ_0$ through $DQ_7$, at which output data is presented during a read operation, and at which input data is received during a write operation. Input/output circuitry 20 is connected between data bus 22 and terminals DQ, and includes conventional input and output buffers connected thereto. A preferred type of output buffer is described in copending application Ser. No. 809,397, filed contemporaneously herewith, assigned to SGS-Thomson Microelectronics, Inc., and incorporated herein by this reference.

Each of array blocks $10_0$ through $10_{15}$ is associated with a corresponding group of sense amplifiers $13_0$ through $13_{15}$, as shown in FIG. 1. In this example, eight individual sense amplifiers 13 are included within each group of sense amplifiers $13_0$ through $13_{15}$, one sense amplifier 13 for each of the eight bits to be communicated on internal data bus 22 from the selected one of array blocks $10_0$ through $10_{15}$. Groups of data drivers $15_0$ through $15_{15}$ are each associated with a corresponding group of sense amplifiers $13_0$ through $13_{15}$ for receiving the data signal therefrom and for driving internal data bus 22 therewith; individual data drivers 15 are associated with individual sense amplifiers 13 in each group, one data driver 15 for driving each line in data bus 22.

Figure 5:
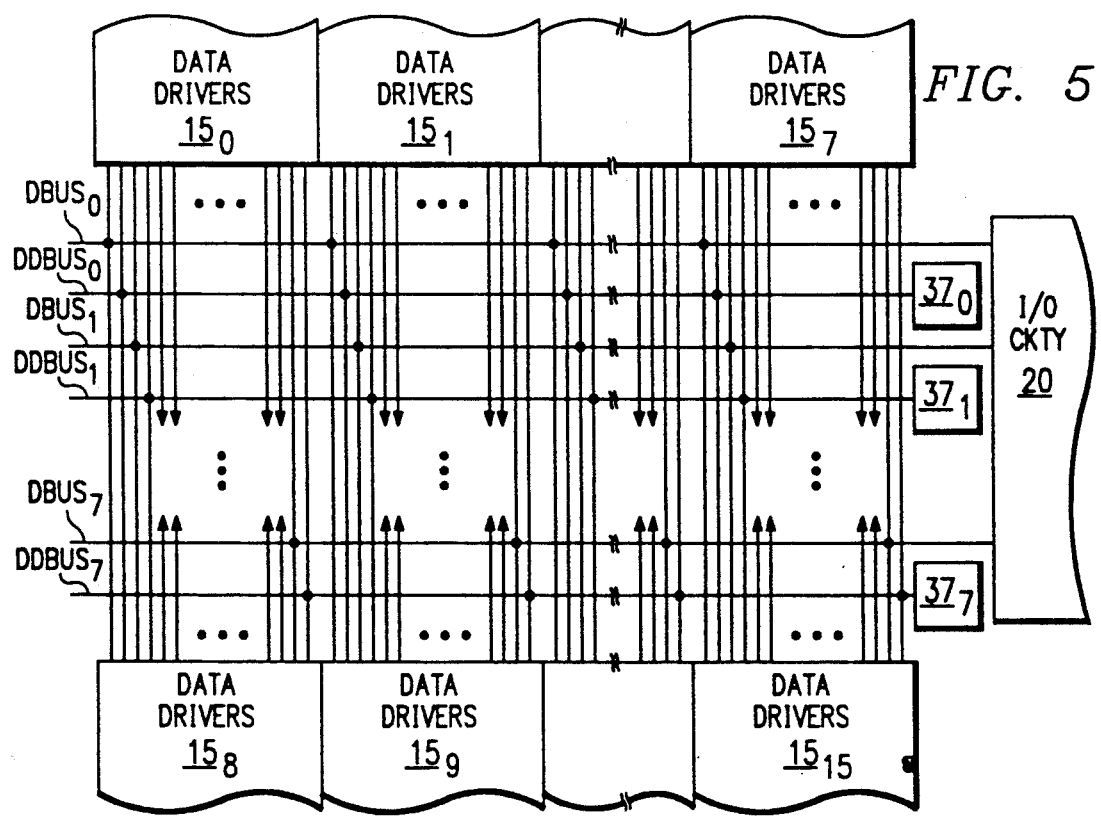
FIG. 5 is an electrical diagram, in block form, illustrating the connection of the data conductors and dummy data conductors to the data driver circuits for each array block.

In this example, the memory array is also divided into halves, with array blocks $10_0$ through $10_7$ in one array half and array blocks $10_8$ through $10_{15}$ in the other half. Internal data bus 22 runs the length of the array halves, and is located therebetween as shown in FIGS. 1 and 5. As shown in FIG. 5, data bus 22 includes data conductors $DBUS_0$ through $DBUS_7$, each associated with an input/output terminal $DQ_0$ through $DQ_7$, (and coupled thereto via input/output circuitry 20). Each individual data conductor $DBUS_k$ is connected to a corresponding data driver 15 in each of the sixteen data driver groups $15_0$ through $15_{15}$ of the sixteen array blocks $10_0$ through $10_{15}$. For a read/write memory such as memory 1, a separate input data bus can be used to communicate input data to be written to the selected memory cells, in the conventional manner. Alternatively, the input data may also be communicated along data bus 22, as is conventional for some memory designs.

Data bus 22 also includes eight dummy data conductors $DDBUS_0$ through $DDBUS_7$, each of which are also connected to a corresponding data driver 15 in each of the sixteen data driver groups $15_0$ through $15_{15}$ of the sixteen array blocks $10_0$ through $10_{15}$. Dummy data conductors $DDBUS_0$ through $DDBUS_7$ are used for precharging of data bus 22, as will be described hereinbelow, and not for communication of a data state; as such, dummy data conductors $DDBUS_0$ through $DDBUS_7$ are not coupled to input/output circuitry 20 for communication of data to and from terminals DQ, but instead are terminated by terminations 37, as shown in FIG. 5. To ensure proper precharge of data conductors DBUS, each of dummy data conductors DDBUS preferably physically resembles one of data conductors DBUS, having substantially the same length and cross-sectional area, and being formed of the same material.

In the arrangement of FIGS. 1 and 5, it is therefore apparent that each of the data conductors DBUS in data bus 22 will be relatively long, running much of the length of the chip in order to connect to data drivers 15 for each of the array blocks 10. As such, the series resistance of each data bus conductor DBUS can be quite high, even when formed of metal such as aluminum, especially in high density circuits. For example, each data bus conductor DBUS can be on the order of 13,200$\mu$ long, with a cross-sectional area of on the order of 1.1 $\mu_2$; an aluminum conductor of these dimensions will have a series resistance of on the order of 550 $\Omega$. In addition, with many (e.g., sixteen) data drivers 15 connected to each data bus conductor DBUS, as well as the input/output circuitry 20 connected thereto, the capacitance associated with a single data bus conductor DBUS can be on the order of 4 pF. The R-C load of data bus conductors DBUS can thus be quite significant, requiring on the order of 2.2 nsec to switch from rail-to-rail (5 volts) for typical on-chip drivers, and thus directly and significantly impacts the read access time of the memory. Due to the size of write drivers available in input/output circuitry 20, and also where a separate input data bus is provided, the write time may not be affected to the same degree; in addition, the duration of the write operation is generally not as critical a parameter in a high speed memory as the read access time. As will be described hereinbelow, use of dummy data conductors DDBUS according to the present invention can provide significant reduction in the access time of memory 1.

Figure 2:
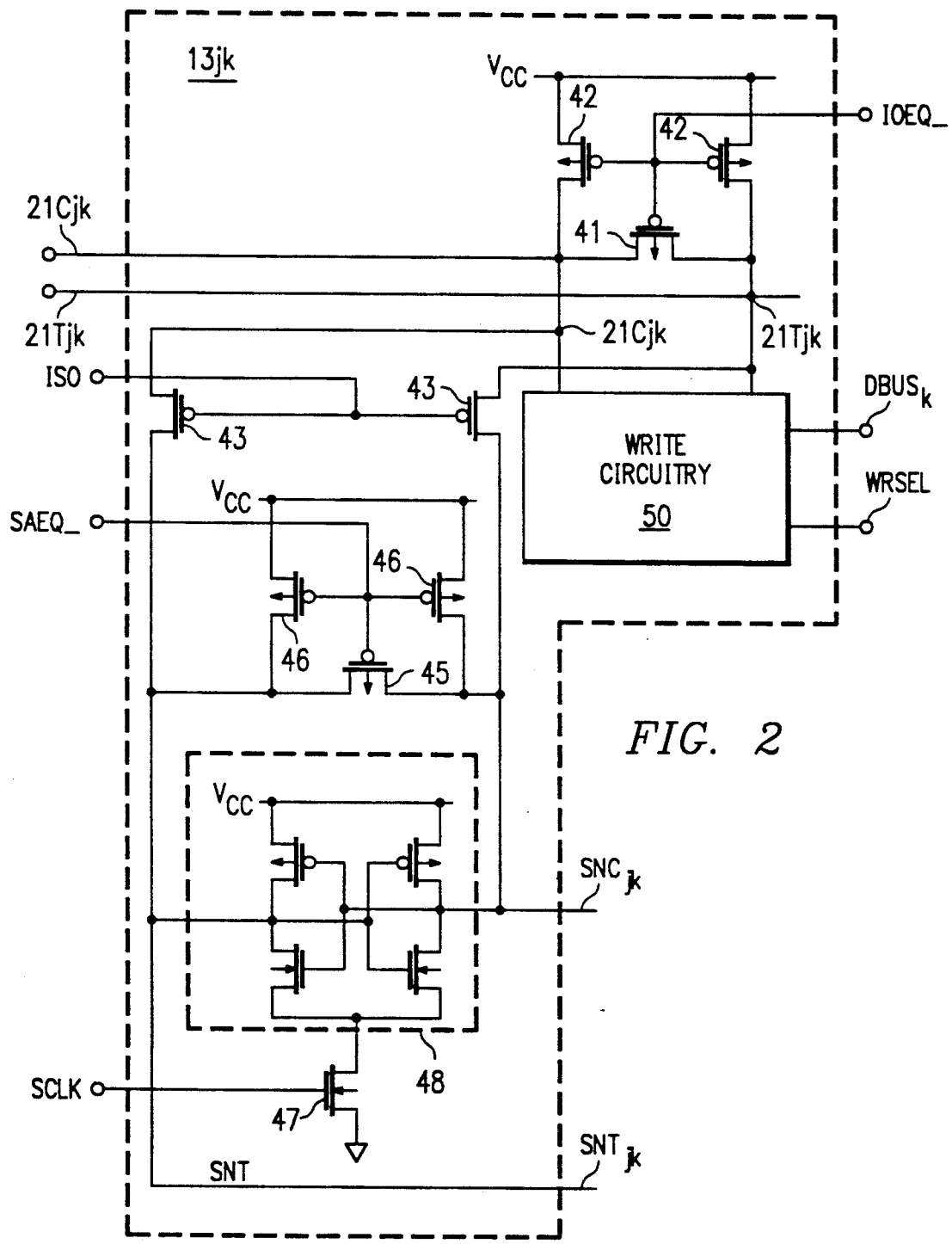
FIG. 2 is an electrical diagram, in schematic form, of one of the sense amplifiers and data drivers in the memory circuit of FIG. 1.

Referring now to FIG. 2, the construction of an example of one of sense amplifiers 13 will now be described in detail. Further detail concerning this example of sense amplifier 13, and its operation relative to column decoder 26, is described in copending application Ser. No. 627,049, filed Dec. 13, 1990, assigned to SGS-Thomson Microelectronics, Inc. and incorporated herein by this reference. Sense amplifier $13_{jk}$ of FIG. 2 is the sense amplifier associated with array group $10_j$ and input/output terminal $DQ_k$.

Of course, other sense amplifier designs may alternatively be used in connection with the present invention. One example of such an alternative design is a multiple stage sense amplifier scheme, including a level shifter stage connected to each of the differential bit lines for implementing a DC level shift thereon, followed by a combination of a current mirror and differential sense amplifier (the differential sense amplifier similar as that shown in FIG. 2). Other sense amplifier configurations and implementations may similarly be used, in the alternative to that shown in FIG. 2.

In the example of FIG. 2, complementary input/output lines $21T_{jk}$, $21C_{jk}$ (T for true and C for complement) are coupled, via column decoder 26, to the bit lines of the selected memory cell in array group $10_j$ associated with input/output terminal $DQ_k$; in a read operation, input/output lines $21T_{jk}$, $21C_{jk}$ communicate data from the selected memory cell, and in a write operation input/output lines $21T_{jk}$, $21C_{jk}$ communicate data to the selected memory cell. Input/output lines $21T_{jk}$, $21C_{jk}$ are each connected to the drain of a p-channel precharge transistor 42; the sources of transistors 42 are both connected to the precharge voltage for the input-/output lines $21T_{jk}$, $21C_{jk}$, which in this case is $V_{cc}$. Input/output lines $21T_{jk}$, $21C_{jk}$ are also connected to one another by p-channel equilibration transistor 41. The gates of transistors 41 and 42 are connected to line IOEQ_, which is generated by timing control circuitry 22 responsive to an address transition detected by ATD circuit 25, or to such other events during the cycle for which equilibration of input/output lines 21 are desired.

On the read side of sense amplifier $13_{jk}$, input/output lines $21T_{jk}$, $21C_{jk}$ are each connected to a p-channel pass transistor 43, each of pass transistors 43 having its gate controlled by an isolate signal ISO. Accordingly, input-/output lines $21T_{jk}$, $21C_{jk}$ may be isolated from the read circuitry by line ISO at a high logic level, and may be connected thereto by line ISO at a low logic level. The complementary lines on the opposite side of pass transistors 43 from input/output lines $21T_{jk}$ and $21C_{jk}$ are referred to in FIG. 2 as sense nodes $SNT_{jk}$ and $SNC_{jk}$, respectively.

Sense nodes $SNT_{jk}$, $SNC_{jk}$ are also preferably precharged and equilibrated (in this example, to the voltage $V_{cc}$) during the appropriate portion of the cycle, as sense amplifier 48 within sense amplifier 13 operates in dynamic fashion, as will be described hereinbelow. P-channel precharge transistors 46 each have their source-to-drain paths connected between $V_{cc}$ and sense nodes $SNT_{jk}$ and $SNC_{jk}$, respectively. Equilibration transistor 45 is a p-channel transistor having its source-to-drain path connected between sense nodes $SNT_{jk}$ and $SNC_{jk}$. The gates of transistors 45 and 46 are all controlled by line SAEQ_ which, when at a low level, precharges and equilibrates sense nodes $SNT_{jk}$ and $SNC_{jk}$ in similar manner as input/output lines $21T_{jk}$ and $21C_{jk}$, described above, and as the bit lines in array block $10_j$.

Sense amplifier 48 is a conventional CMOS latch consisting of cross-coupled inverters therewithin; the inputs and outputs of the cross-coupled latches are connected to sense nodes $SNT_{jk}$, $SNC_{jk}$ in the conventional manner. N-channel pull-down transistor 47 has its source-to-drain path connected between the sources of the n-channel transistors in sense amplifier 48 and ground, and has its gate controlled by line SCLK.

Pull-down transistor 47 provides dynamic control of sense amplifier 48, so that the sensing of sense nodes $SNT_{jk}$, $SNC_{jk}$ is performed in dynamic fashion. As is well known in dynamic RAMs, the dynamic sensing in this arrangement is controlled with transistor 47 initially off at the time that pass transistors 43 connect sense nodes $SNT_{jk}$, $SNC_{jk}$ to input/output lines $21T_{jk}$, $21C_{jk}$, respectively; during this portion of the cycle, sense amplifier 48 is presented with a small differential voltage between sense nodes $SNT_{jk}$ and $SNC_{jk}$. After development of this small differential voltage, line SCLK is driven high, so that the sources of the pull-down transistors in sense amplifier 48 are pulled to ground. This causes sense amplifier 48 to develop a large differential signal on sense nodes $SNT_{jk}$ and $SNC_{jk}$, and latch the sensed state thereof.

As will be apparent from the description hereinbelow, each sense amplifiers $13_{jk}$ associated with the same data conductor $DBUS_k$ are coupled to one another in essentially wired-OR fashion. Accordingly, the control signals ISO, SAEQ_, and SCLK which are presented to the read side of sense amplifier $13_{jk}$ are preferably generated by column decoder 26 in conjunction with timing control circuitry 29. Such generation of these control signals provides that the ones of sense amplifier $13_{jk}$ associated with unselected array blocks 10 are not enabled (by lines ISO maintained high, and lines SAEQ_ and SCLK maintained low) so as to maintain their sense nodes $SNT_{jk}$ and $SNC_{jk}$ equilibrated and precharged to $V_{cc}$, preventing bus conflict on data bus 22.

On the write side of sense amplifier $13_{jk}$, write circuitry $50_{jk}$ receives input data from data conductor $DBUS_k$ associated therewith, and a control signal on line WRSEL from timing and control circuitry 29. In write operations, write circuitry $50_{jk}$ presents the data state of data conductor $DBUS_k$ in complementary fashion on input/output lines $21T_{jk}$, $21C_{jk}$ in the conventional fashion. The above-referenced copending application Ser. No. 627,049 describes a preferred example of write circuitry $50_{jk}$, in further detail.

Figure 3:
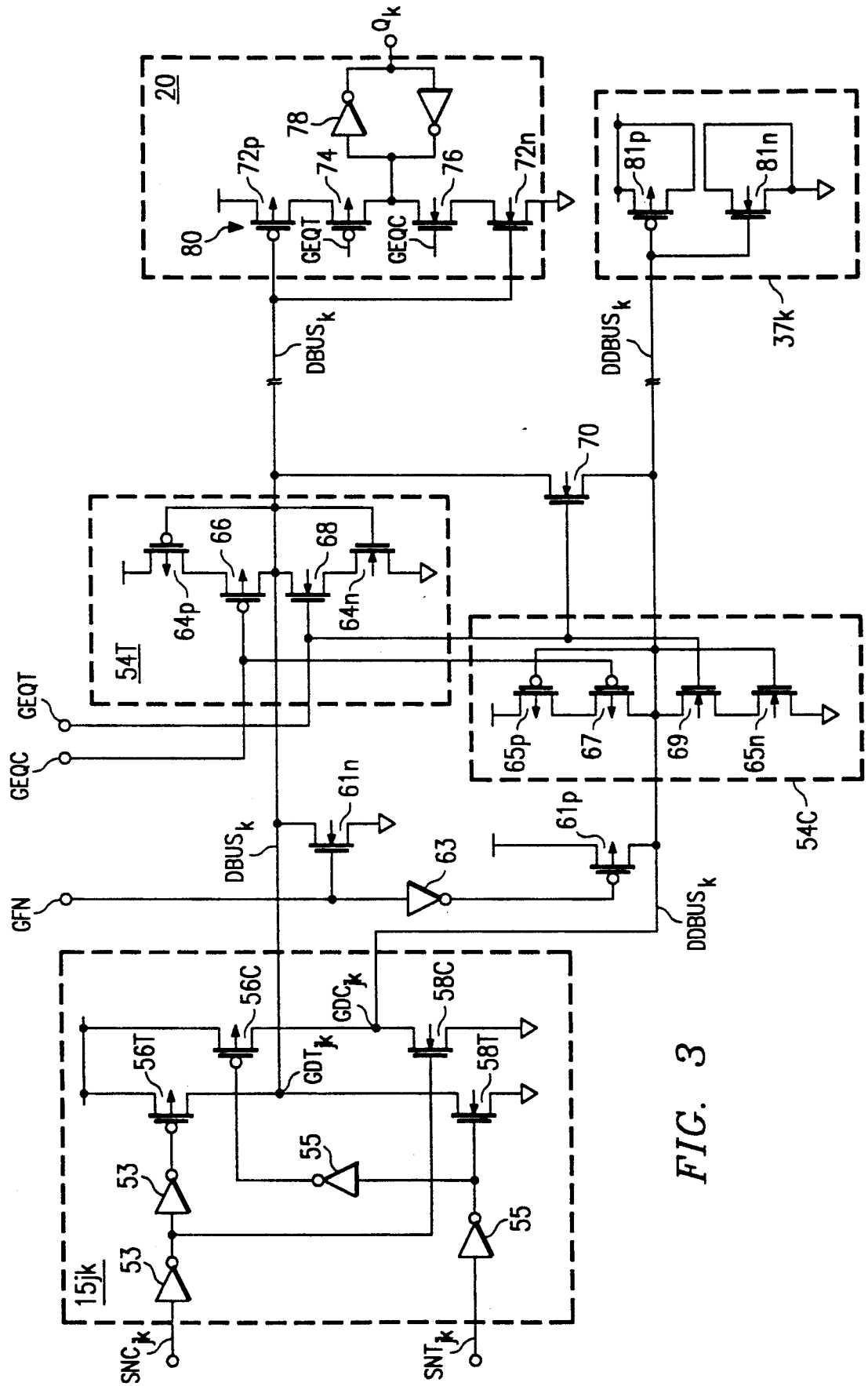
FIG. 3 is an electrical diagram, in schematic form, of the combination of one of the data conductors and its associated dummy data conductor according to the preferred embodiment of the invention.

Referring now to FIG. 3, the construction and operation of one of data drivers 15 according to the preferred embodiment of the invention will now be described in detail. Data driver $15_{jk}$ of FIG. 3 is associated with input/output terminal $DQ_k$ and with array block $10_j$, and accordingly receives, as inputs, nodes $SNT_{jk}$ and $SNC_{jk}$ from sense amplifier $13_{jk}$ of FIG. 2.

Nodes $SNT_{jk}$ and $SNC_{jk}$ are received at inputs of tristate data driver $15_{jk}$. According to this embodiment of the invention, and as will become apparent hereinbelow, data conductors DBUS and dummy data conductors DDBUS must each be driven by tristate drivers, in order to enable their precharging by way of charge sharing with one another. In addition, since multiple data drivers 15 drive the same data conductors DBUS (and dummy data conductors DDBUS), each of data drivers 15 must have a high-impedance state to avoid bus contention problems. In prior memory configurations, this is generally accomplished by merely turning off the sense amplifiers. However, since sense amplifiers 13 in this example precharge their output nodes SNT, SNC high (as is the case in many memory circuits), this state does not necessarily prevent the active driving of data conductors DBUS.

Other prior schemes, in which sense amplifier outputs are precharged to the same voltage, have included an enable signal for controlling tristate data drivers. In these prior schemes, however, an additional signal line must be provided for each data driver, as well as the necessary circuitry for generating this additional signal and also a relatively complex data driver capable of responding to the additional signal. Still other conventional schemes included a series pass gate between the sense amplifier and the internal data bus, such a pass gate adding its propagation delay time in the critical read path, and thus being undesirable.

Data driver $15_{jk}$ according to the preferred embodiment of the invention provides tristate capability in a simple and effective manner. Driver $15_{jk}$ includes two push-pull driver circuits therein, for driving complementary nodes $GDT_{jk}$ and $GDC_{jk}$, respectively, which in turn are connected to data conductor $DBUS_k$ and dummy data conductor $DDBUS_k$, respectively. These push-pull drivers each include p-channel pull-up transistor 56 and n-channel pull-own transistor 58, having their source/drain paths connected in series between $V_{cc}$ and ground; the output of each of the drivers is, in the conventional sense, at the common drain of transistors 56 and 58. In this example, the drains of transistors 56T, 58T at node $GDT_{jk}$ are connected to data conductor $DBUS_k$, and the drains of transistors 56C, 58C at node $GDC_{jk}$ are connected to dummy data conductor $DDBUS_k$. Referring back to FIGS. 1 and 5, similar nodes GDT, GDC in the other fifteen data drivers 15 are similarly connected to data conductor $DBUS_k$ and dummy data conductor $DDBUS_k$, thus necessitating the ability of drivers 15 to have a high-impedance output state.

Node $SNC_{jk}$ is connected to the gate of pull-up transistor 56T after inversion by two inverters 53, and is connected to the gate of pull-down transistor 58C after inversion by one of inverters 53. Conversely, node $SNT_{jk}$ is connected directly to the gate of pull-up transistor 56C via two inverters 55, and to the gate of pull-down transistor 58T after inversion by one of inverters 55. The connection of two inverters 53, 55 to nodes $SNC_{jk}$ and $SNT_{jk}$, respectively, provides a balanced load to the differential output of sense amplifier $13_{jk}$.

In operation, when sense amplifier $13_{jk}$ is on, and senses a logic "one" state in the selected memory cell, node $SNT_{jk}$ will be high and node $SNC_{jk}$ will be low. Accordingly, transistors 58T and 56C will both be off, and transistors 56T and 58C will both be on, driving node $GDT_{jk}$ to a high logic level and driving node $GDC_{jk}$ to a low level. Conversely, when sense amplifier $13_{jk}$ senses a logic "zero" state, node $SNT_{jk}$ will be low and node $SNC_{jk}$ will be high; this turns on transistors 58T, 56C, turns off transistors 56T, 58C, and thus drives node $GDT_{jk}$ low and node $GDC_{jk}$ high.

As described hereinabove, sense amplifier $13_{jk}$ is turned off when its array block $10_j$ is not selected (or during a write operation). In this embodiment, sense amplifier $13_{jk}$ drives both of its nodes $SNT_{jk}$, $SNC_{jk}$ high when disabled, by operation of transistors 45, 46 being turned on and transistors 43 and 47 being turned off (see FIG. 2). A high logic level on node $SNC_{jk}$ turns off transistors 56T, 58C, and a high logic level on node $SNT_{jk}$ turns off transistors 56C, 58T. Accordingly, both pull-up transistors 56 and both pull-down transistors 58 are turned off by sense amplifier $13_{jk}$ being turned off, placing nodes $GDT_{jk}$ and $GDC_{jk}$ at their output in a high-impedance state. This tristate condition is therefore obtained without requiring the generation and communication of an additional signal, but is accomplished as a response to the precharged condition of sense amplifier $13_{jk}$. Accordingly, to enable precharge and equilibration of data conductors DBUS and dummy data conductors DDBUS, driver $15_{jk}$ is placed in a high impedance state during precharge and equilibration, as signal SAEQ_ is at a low logic level during this time (placing both nodes $SNT_{jk}$, $SNC_{jk}$ high at that time).

Data bus conductors DDBUS and dummy data bus conductors DDBUS can all biased to known complementary voltages, by way of transistors $61n$, $61p$ and signal GFN. A single placement of transistors $61n$, $61p$ for each data bus conductor $DDBUS_k$ and dummy data bus conductor $DDBUS_k$ may be sufficient, or alternatively multiple placements of transistors $61n$, $61p$ may be used. Data bus conductor $DDBUS_k$ is connected to the drain of n-channel transistor $61n$, which has its source connected to ground and its gate connected to line GFN; dummy data bus conductor $DDBUS_k$ is connected to the drain of p-channel transistor $61p$, which has its source biased to $V_{cc}$ and its gate connected to line GFN via inverter 63. Accordingly, when line GFN when is at high logic level, data conductor $DBUS_k$ is biased to ground, and dummy data conductor $DDBUS_k$ are biased to $V_{cc}$; conversely, when line GFN is low, transistors $61n$, $61p$ are both off and do not affect the level of data bus conductors $DDBUS_k$ and dummy data bus conductors $DDBUS_k$, respectively, as is case during normal operation. Line GFN is preferably driven high during write operations (where a separate internal input data bus is used) and during such times as memory 1 is deselected, so hat a complementary relationship between each data conductor DBUS and its dummy data bus conductor DDBUS is maintained at all times.

Memory 1 further includes self-biasing circuits 54T, 54C, each connected to data conductor $DBUS_k$ and dummy data conductor $DDBUS_k$, respectively, to maintain these lines from floating during equilibration and precharge. A single self-biasing circuits 54T, 54C may be implemented for each data conductor $DBUS_k$ and dummy data conductor $DDBUS_k$ in memory 1, or alternatively multiple self-biasing circuits 54T, 54C may be used for each data conductor $DBUS_k$ and dummy data conductor $DDBUS_k$, depending upon the drive required to maintain the precharged state thereof. As is well known, noise can capacitively couple to floating nodes in integrated circuits, such that the potential of such nodes can rise or fall to any potential, especially during long equilibration periods such as can occur if the addresses received by memory 1 are unstable. As will be apparent hereinbelow, floating of data conductors DBUS to a voltage significantly different from the preferred mid-level voltage can push out the access time of the memory if the next data state to be driven is the opposite from that to which one or more of data conductors DBUS floated.

Self-biasing circuit 54T includes p-channel transistors 64p and 66 which have their source/drain paths connected in series between $V_{cc}$ and data bus conductor DDBUS$_k$, and n-channel transistors 64n and 68 which have their source/drain paths connected in series between data bus conductor DDBUS$_k$ and ground. The gates of transistors 64p and 64n are both connected to data bus conductor DDBUS$_k$ to maintain its precharged state as described hereinbelow.

The gate of p-channel transistor 66 is connected to line GEQC, which is a precharge signal active at a low logic level, and the gate of n-channel transistor 68 is connected to line GEQT, which is a precharge signal active at a high logic level. Lines GEQT and GEQC (which are the logical complements of one another), are generated by timing and control circuitry 29 as high and low logic level pulses, respectively, which control the initiation and duration of the precharge of data conductors DBUS. In this embodiment of the invention, lines GEQT, GEQC are derived by timing and control circuitry 29 from the pulse on line ATD generated by ATD circuit 25 responsive to detection of a transition at one or more of address terminals $A_0$ through $A_n$, and communicated along control bus CBUS. Derivation of the precharge signals from address transition detection enables precharging of data conductors DBUS at the appropriate early portion of the cycle, since a new memory cycle in an SRAM such as memory 1 begins with receipt of a new address. Such precharge at the beginning of the cycle, rather than at the end, is of course preferred for SRAMs since the duration of the cycle is indeterminate.

Self-biasing circuit 54C is similarly constructed, with p-channel transistors 65p, 67 having their source/drain paths connected in series between dummy data bus conductor DDBUS$_k$ and $V_{cc}$, and with n-channel transistors 65n, 69 having their source/drain paths connected in series between dummy data bus conductor DDBUS$_k$ and ground. The gates of transistors 65p, 65n are connected to dummy data bus conductor DDBUS$_k$, and the gates of transistors 67, 69 are connected to precharge lines GEQC, GEQT, respectively.

In operation, self-biasing circuits 54T, 54C are enabled only during the precharge and equilibration operation, when line GEQT is high and line GEQC is low. When enabled, the voltage at data bus conductor DBUS$_k$ (for the case of self-biasing circuit 54T) will determine the state of transistors 65p or 65n. As noted hereinabove and as will be described hereinbelow, data conductor DBUS$_k$ is not actively driven during precharge. Accordingly, if noise couples to data conductor DBUS$_k$ which causes its voltage to rise, transistor 64n will tend to turn on harder, and discharge data conductor DBUS$_k$ until such time as its voltage turns off transistor 64n (or turns it on to a lesser degree than transistor 64p is turned on). Self-biasing circuit 54C operates in the same manner relative to dummy data conductor DDBUS$_k$. Accordingly, self-biasing circuits 54T, 54C keep data conductors DBUS and dummy data conductors DDBUS from floating during precharge, particularly during long precharge and equilibration operations.

The terminal end of data conductor DBUS$_k$ is received by input/output circuitry 20, specifically at the gates of p-channel pull-up transistor 72p and n-channel pull-down transistor 72n in output stage 80. The source/drain paths of transistors 72p, 72n are connected in series, between $V_{cc}$ and ground, with the source/drain paths of transistors 74, 76. The gate of p-channel transistor 74 is connected to line GEQT, and the gate of n-channel transistor 76 is connected to line GEQC, and their drains are connected together. Latch 78, consisting of cross-coupled inverters, has its input connected to the drains of transistors 74, 76; the output of latch 78, node $Q_k$, is forwarded to the output buffers of memory 1 for presentation thereat.

In operation, during precharge and equilibration (line GEQT high and line GEQC low), the state of data conductor DBUS is isolated from affecting node $Q_k$, as transistors 74, 76 are both turned off. During normal operation, transistors 74, 76 are on and output stage 80 operates as a conventional CMOS inverter. Since transistors 74, 76 in output stage 80 are turned off during the precharge and equilibration period, output stage 80 is disabled from responding to the state of data conductor DBUS$_k$. This allows data conductor DBUS$_k$ to be safely precharged to a voltage near the trip point of output stage 80, without resulting in oscillations of the output circuitry as would otherwise occur if output stage 80 remained enabled during precharge.

It is preferred that self-biasing circuit 54T (and self-biasing circuit 54C, for symmetry) be constructed in such a manner that its bias point is near the trip point of output stage 80 driven by data conductor DBUS. As such, the push-pull construction of self-biasing circuit 54T matches the construction of output stage 80. In order to minimize the current drawn through self-biasing circuits 54T, 54C, it is preferred that the sizes of the transistors therein be scaled from those in output stage 80. For example, the channel widths of the transistors in self-biasing circuits 54T, 54C are preferably on the order of one-fourth of the transistors in output stage 80; the channel lengths in self-biasing circuits 54T, 54C are preferably longer, for example by a factor of three, than in output stage 80. The bias current provided by self-biasing circuits 54T, 54C is therefore quite small, but is sufficient to keep data conductors DBUS from floating to a voltage significantly different from its precharged level.

It is contemplated that self-biasing circuits 54T, 54C may also be beneficial when implemented in other data bus arrangements, for example a differential data bus where each bit of data is communicated by a differential (or complementary) signal carried on a pair of data bus lines. The advantages of maintaining the precharged level on differential conductors as described hereinabove may thus be obtained in these arrangements, as well.

Equilibration transistor 70 has its source/drain path connected between data conductor DBUS$_k$ and dummy data conductor DDBUS$_k$, and has its gate connected to line GEQT (transistor 70 being n-channel). Transistor 70 is therefore turned on during precharge (line GEQT high), and will effect the precharging of data conductor DBUS by way of charge sharing, as will be described hereinbelow. Alternatively, a p-channel transistor with its gate controlled by line GEQC may be used in place of, or in parallel with, n-channel equilibration transistor 70. In addition, it may be preferable in some cases to provide multiple transistors 70 for each data conductor $DBUS_k$ and dummy data conductor $DDBUS_k$, for example one transistor 70 at each end thereof; of course, depending upon the size of transistor 70, a single placement may be sufficient.

As illustrated in FIG. 5, dummy data conductors DDBUS are terminated by terminations 37. Terminations 37 provide a load to dummy data conductor DDBUS which matches that presented by output stage 80 to data conductors DBUS. In the example of FIG. 3, termination $37_k$ includes p-channel transistor $81p$ which has its source and drain connected together to $V_{cc}$, and n-channel transistor $81n$ which has its source and drain connected together to ground; the gates of transistors $81p$ and $81n$ are connected to dummy data conductor $DDBUS_k$. Termination $37_k$ thus presents the equivalent capacitance (i.e., the gate capacitance of a CMOS inverter) to dummy data conductor $DDBUS_k$ that output stage 80 presents to data conductor $DBUS_k$.

Figure 4:
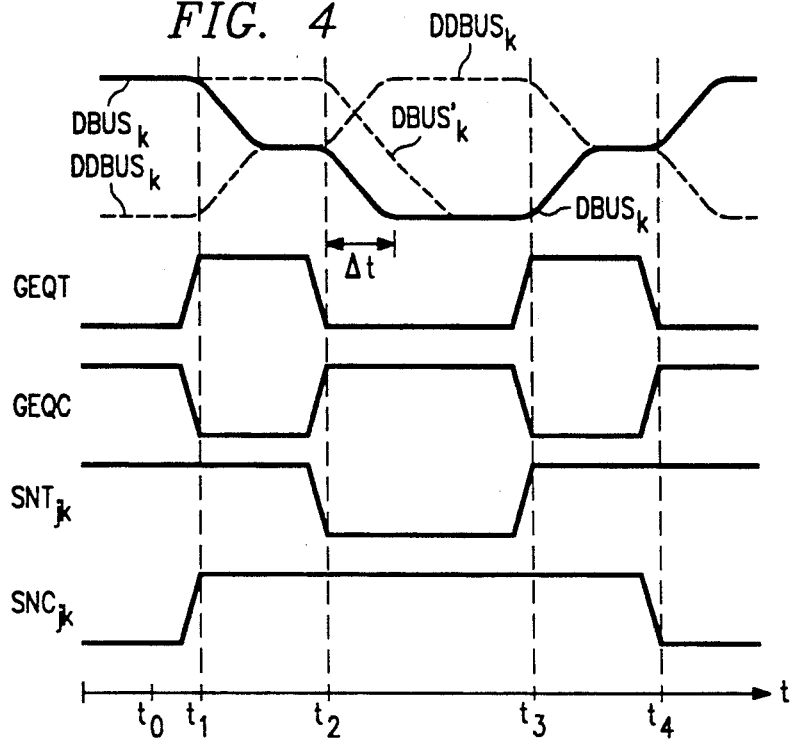
FIG. 4 is a timing diagram illustrating the operation of the preferred embodiment of the invention.

Referring now to FIG. 4, the operation of the preferred embodiment of the invention will now be described in detail. At time $t_0$ in this example, data conductor $DBUS_k$ is at a high level and dummy data conductor $DDBUS_k$ is at a low level, due to the complementary operation of tristate driver $15_{jk}$ as a result of node $SNT_{jk}$ at a high level and node $SNC_{jk}$ at a low level. Also at time $t_0$, since the access of the selected memory cell has been active for some time, precharge lines GEQT and GEQC are low and high, respectively.

The precharge and equilibration operation begins at time $t_1$, which is a specified time after the beginning of the next cycle; as noted hereinabove, a new cycle in memory 1 can be initiated by a transition at one or more of address terminals $A_0$ through $A_n$, at the end of a write operation, or upon receipt of a chip enable signal. Responsive to detection of this transition, at time $t_1$, line GEQT is driven to a high level, line GEQC is driven low; also at this time, sense amplifier $13_{jk}$ is turned off by way of lines SAEQ_ and SCLK, so that node $SNC_{jk}$ goes to a logic high level. With both nodes $SNT_{jk}$ and $SNC_{jk}$ high, tristate driver $15_{jk}$ enters a high impedance state.

Prior to time $t_1$, data conductor $DBUS_k$ and dummy data conductor $DDBUS_k$ (since all other sense amplifiers 13 and tristate drivers 15 are in a high impedance state, having not been selected in this cycle) are at high and low logic levels, respectively. As line GEQT goes to a high level at time $t_1$, transistor 70 turns on, connecting data conductor $DBUS_k$ to dummy data conductor $DDBUS_k$. Since tristate driver $15_{jk}$ enters its high impedance state at this time and no longer actively drives either data conductor $DBUS_k$ and dummy data conductor $DDBUS_k$, transistor 70 initiates charge sharing between data conductor $DBUS_k$ and dummy data conductor $DDBUS_k$. Data conductor $DBUS_k$ and dummy data conductor $DDBUS_k$ thus discharge and charge, respectively, to a common potential near the mid-level between high and low logic levels. Precharge of data conductor $DBUS_k$ is then complete.

Also during this time, output stage 80 is disabled from responding to the precharged state of data conductor $DBUS_k$, as transistors 74, 76 therein are held off by lines GEQC, GEQT, respectively.

For purposes of clarity, the duration of precharge and equilibration between times $t_1$ and $t_2$, as illustrated in FIG. 4, is relatively short. As such, the voltage of data conductor $DBUS_k$ and dummy data conductor $DDBUS_k$ is not likely to significantly drift from its precharged level as a result of capacitively coupled noise. However, in memory 1 as in many SRAM and DRAM memory devices, the precharge and equilibration period can be quite long, for example on the order of microseconds. In an SRAM device where precharge and equilibration are triggered by address transition detection, such as memory 1, a long precharge and equilibration period can result from unstable, or high frequency, address signals applied to memory 1. In clocked circuits, such as FIFOs, DRAMs, embedded memories in microprocessors, microprocessors themselves, and the like, a low frequency or long duty cycle clock signal will cause a long precharge and equilibration period.

Self-biasing circuits 54T, 54C prevent data conductors DBUS and dummy data conductors DDBUS from drifting far from their precharged voltage, even during long precharge and equilibration periods. As noted hereinabove relative to FIG. 3, if data conductor $DBUS_k$ receives noise which causes it to drift upward, transistor $64n$ (and transistor $65n$, due to transistor 70 being on) will turn on harder, discharging data conductor $DBUS_k$ (and dummy data conductor $DDBUS_k$) to ground; transistors $64p$, $65p$ operate similarly if data conductor $DBUS_k$ and dummy data conductor $DDBUS_k$ drift low. As a result, the precharged level of data bus conductors DBUS in data bus 22 of memory 1 is maintained, and is maintained near the trip point of output stage 80, in the preferred embodiment of the invention, even over long precharge and equilibration periods.

Referring back to FIG. 4, the next read access operation begins at time $t_2$, with lines GEQT, GEQC returning low and high, respectively. For clarity of explanation, it is presumed that the next access is also from array block $10_j$; the operation of data conductor $DBUS_k$ will be similar, however, if a different array block 10 were selected. With the end of precharge at time $t_2$, sense amplifier $13_{jk}$ is again enabled. In this example, the next data state to be presented is a "0", and accordingly node $SNT_{jk}$ is driven low by sense amplifier $13_{jk}$ at the end of the precharge and equilibration period. Self-biasing circuits 54T, 54C are disabled by lines GEQT, GEQC returning low and high, respectively, and therefore data driver $15_{jk}$ begins driving data conductor $DBUS_k$ low from the precharged level (and also begins driving dummy data conductor $DDBUS_k$ high).

Also at this time, upon the return of lines GEQT, GEQC low and high, respectively, output stage 80 is again enabled to receive the data state on data conductor $DBUS_k$. Since the construction of output stage 80 and self-biasing circuit 54T is similar, except for transistor scaling, the precharged voltage to which data conductor $DBUS_k$ is held is quite close to the trip voltage of output stage 80. Accordingly, input/output circuitry 20 can respond very quickly to the discharging (in this case) of data conductor $DBUS_k$ from its midlevel voltage, in this case immediately after time $t_2$. This provides savings in the access time of memory 1 from that in prior configurations where data conductors in data buses would, in the worst case, have to be switched from rail-to-rail. FIG. 4 illustrates the rail-to-rail discharging of data conductor $DBUS_k'$ in such a prior arrangement. Assuming that the new access begins at the same time (i.e., time $t_2$), prior data conductor DBUS$_k'$ does not reach the trip point of output stage 80 until well after time t$_2$, due to the R-C load presented thereby to its driver. The access time savings provided by the present invention is illustrated in FIG. 4 by $\Delta$t, which in modern high speed SRAMs can be on the order of 1.5 to 2.0 nsec, and thus on the order of 10% of the overall access time of memory 1.

During the active period between times t$_2$ and t$_3$, dummy data conductor DBUS$_k$ is driven by tristate driver 15$_{jk}$ to the opposite data state (in this case a "1") from that of data conductor DBUS$_k$. Termination 37$_k$ adds a load to dummy data conductor DDBUS$_k$ similar to that of output stage 80, and as such the switching of dummy data conductor DBUS$_k$ matches, in a complementary fashion, the switching of data conductor DBUS$_k$. As a result, the state of dummy data conductor DDBUS$_k$, is complementary to that of data conductor DDBUS$_k$ at all times during the active period, even during the transient switching time. The provision of the matching load by termination 37$_k$ thus allows the next precharge operation to begin at any time, as may occur in circuits such as SRAM memory 1, ensuring that charge sharing will precharge data conductor DBUS$_k$ to the proper midlevel voltage.

The opposite transition of data conductor DBUS$_k$ is illustrated in FIG. 4, beginning with precharge and equilibration at time t$_3$. In this case, as lines GEQT, GEQC are driven high and low, respectively node SNT$_{jk}$ is pulled high to place tristate driver 15$_{jk}$ in its high impedance state, transistor 70 is turned on to equilibrate data conductor DBUS$_k$ and dummy data conductor DDBUS$_k$ which are thus precharged, by way of charge sharing, to a midlevel voltage. Self-biasing circuits 54T, 54C operate as before to maintain this precharged level on data conductor DDBUS$_k$. Beginning at time t$_4$, the next access begins with lines GEQT, GEQC returning low and high, respectively, at which time the new high level data state is presented by node SNC$_{jk}$ driven low by sense amplifier 13$_{jk}$.

The present invention thus provides the significant advantage of improved access times, by reducing the time required to switch high capacitance internal data buses. The instantaneous dynamic current drawn by memory 1 is also reduced, as the switching voltage of the data conductors in the internal data bus is reduced by approximately one-half. These advantages are achieved by way of charge sharing, thus not requiring generation of a precharge voltage driver and the circuitry necessary to apply the generated precharge voltage; in addition, self-biasing circuits are provided to prevent floating of the data bus to undesired voltages, particularly in long precharge and equilibration periods, as such floating could slow the access time in the next cycle. Furthermore, the precharging of the data bus is facilitated by a tristate data driver which enters the high impedance mode by operation of the sense amplifier, without requiring an additional timing and control signal to be applied thereto.

While the invention has been described herein relative to its preferred embodiment, it is of course contemplated that modifications of, and alternatives to, this embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. An integrated circuit, comprising:
   functional circuitry;
   a data bus comprising first and second data conductors, for communicating a differential signal thereon;
   first and second data drivers, each having an input coupled to said functional circuitry for receiving information therefrom, and having an output, for driving said first and second data conductors to a differential voltage corresponding to said information;
   means for generating a control signal upon the initiation of a memory operation;
   a transistor having a conduction path connected between said first and second data conductors, and having a control terminal receiving said control signal, for connecting said first and second data conductors together responsive to said control signal;
   first and second self-biasing circuits coupled to said first and second data conductors, respectively, each biased by first and second bias voltages and comprising:
   a pull-up transistor having a conduction path coupled between its associated data conductor and said first bias voltage, and having a control terminal connected to its associated data conductor, said pull-up transistor being of a conductivity type such that it is conductive responsive to its associated data conductor being at a voltage near said second bias voltage; and
   a pull-down transistor having a conduction path coupled between its associated data conductor and said second bias voltage, and having a control terminal connected to its associated data conductor, said pull-down transistor being of a conductivity type such that it is conductive responsive to its associated data conductor being at a voltage near said first bias voltage.

2. The circuit of claim 1, wherein said functional circuitry comprises:
   an array of memory cells;
   address terminals;
   means for selecting a memory cell responsive to an address signal received at said address terminals; and
   a sense amplifier, for sensing the data state of said selected memory cell.

3. The circuit of claim 2, wherein said control signal generating means comprises:
   an address transition detection circuit, coupled to said address terminals, for detecting logic level transitions thereat, and for presenting a control signal responsive to one of said logic level transitions.

4. The circuit of claim 1, wherein said data bus comprises a plurality of pairs of first and second data conductors;
   wherein said circuit comprises a plurality of said first and second data drivers, each having an input coupled to said functional circuitry for receiving information therefrom, and each having first and second outputs for driving an associated pair of said first and second data conductors with a differential signal corresponding to said information.

5. The circuit of claim 1, further comprising:
   a parallel data driver, having an input coupled to said functional circuitry for receiving information therefrom, having first and second outputs for driving said first and second data conductors with a differential signal corresponding to said information;

wherein said data driver and said parallel data driver are controlled by said functional circuitry so as to not simultaneously drive said first and second data conductors with a differential signal.

6. The circuit of claim 1, wherein each of said self-biasing circuits further comprise:
a first series transistor having a conduction path coupled in series with the conduction path of said pull-up transistor between the data conductor associated with the self-biasing circuit and said first bias voltage; and
a second series transistor having a conduction path coupled in series with the conduction path of said pull-down transistor between the data conductor associated with the self-biasing circuit and said second bias voltage;
wherein said first and second series transistors each have a control terminal coupled to said control signal generating means in such a manner that said first and second series transistors are conductive responsive to said control signal and non-conductive in the absence of said control signal.

7. The circuit of claim 1, further comprising an output stage coupled to said first data conductor, comprising:
an output pull-up transistor having a conduction path coupled between an output node and said first bias voltage, and having a control terminal coupled to said first data conductor in such a manner that said output pull-up transistor is conductive responsive to said first data conductor being at a voltage near said second bias voltage; and
an output pull-down transistor having a conduction path coupled between said output node and said second bias voltage, and having a control terminal coupled to said first data conductor in such a manner that said output pull-down transistor is conductive responsive to said first data conductor being at a voltage near said first bias voltage.

8. The circuit of claim 7, wherein said output stage further comprises:
a first series transistor having a conduction path coupled in series with the conduction path of said output pull-up transistor between said output node and said first bias voltage; and
a second series transistor having a conduction path coupled in series with the conduction path of said output pull-down transistor between said output node and said second bias voltage;
wherein said first and second series transistors each have a control terminal coupled to said control signal generating means in such a manner that said first and second series transistors are non-conductive responsive to said control signal and conductive in the absence of said control signal.

9. The circuit of claim 8, wherein said first self-biasing circuit further comprises:
a first series transistor having a conduction path coupled in series with the conduction path of said pull-up transistor between said first data conductor and said first bias voltage; and
a second series transistor having a conduction path coupled in series with the conduction path of said pull-down transistor between said first data conductor and said second bias voltage;

wherein said first and second series transistors of said first biasing circuit each have a control terminal coupled to said control signal generating means in such a manner that said first and second series transistors of said first biasing circuit are conductive responsive to said control signal and non-conductive in the absence of said control signal.

10. The circuit of claim 7, further comprising:
a termination coupled to said second data conductor, said termination presenting a load to said second data conductor which is substantially similar to the load presented by said output stage to said first data conductor.

11. A method of operating an integrated circuit, said integrated circuit including functional circuitry coupled to a data bus having a pair of differential data conductors therein upon which said functional circuitry presents a differential signal resulting from an operation by said functional circuitry, one of said pair of data conductors connected to an output stage, comprising:
driving said differential data conductors with a differential data signal corresponding to the result of the operation of the functional circuitry;
after said driving step, isolating said data conductors from said functional circuitry;
after said isolating step, connecting said pair of data conductors to one another;
after said isolating step, responsive to a first one of said pair of data conductors having a voltage near a first voltage, turning on a transistor connected between said first data conductor and a second voltage; and
after said isolating step, responsive to said first data conductor having a voltage near said second voltage, turning on a transistor connected between said first data conductor and said first voltage.

12. The method of claim 11, wherein said first one of said data conductors is coupled to said output stage;
and further comprising:
after said driving step, turning off said output stage so that it no longer responds to said first data conductor; and
after said isolating step, turning on said output stage responsive to another operation by said functional circuitry.

13. The method of claim 11, further comprising:
after said isolating step, responsive to another operation by said functional circuitry, disconnecting said pair of data conductors from one another so that another differential signal may be presented thereon.

14. The method of claim 13, wherein said integrated circuit comprises a memory having a plurality of memory cells, each for storing a data state;
and further comprising:
selecting one of said plurality of memory cells in said array;
sensing the stored data state in said selected memory cell; and
driving said pair of data conductors with a differential signal corresponding to the sensed data stored state.

15. The method of claim 14, wherein said plurality of memory cells are arranged in a plurality of array blocks;
wherein each of said array blocks is associated with one of a plurality of data drivers coupled to said pair of data conductors;
and further comprising:

selecting one of said array blocks responsive to an address value; and deselecting the data drivers coupled to said pair of data conductors which are associated with unselected array blocks.

16. The method of claim 13, wherein said functional circuitry comprises a memory comprising:

a plurality of memory cells; and means for selecting one of said plurality of memory cells responsive to an address signal received at a plurality of address terminals;

said method further comprising:

detecting the initiation of an access to one of said plurality of memory cells;

wherein said connecting step is performed responsive to said detecting step.

17. The method of claim 11, further comprising:

after said isolating step, responsive to a second one of said pair of data conductors having a voltage near said first voltage, turning on a transistor connected between said second data conductor and said second voltage; and responsive to said second data conductor having a voltage near said second voltage, turning on a transistor connected between said second data conductor and said first voltage.

* * * * *